US006577435B1

United States Patent
Bang et al.

(10) Patent No.: US 6,577,435 B1
(45) Date of Patent: Jun. 10, 2003

(54) OPTICAL WAVELENGTH CONVERTER BASED ON CROSS-GAIN MODULATION WITH WIDE INPUT POWER DYNAMIC RANGE

(75) Inventors: Joon-Hak Bang, Taejon (KR); Jong-Hyun Lee, Taejon (KR); Jung-Hee Han, Taejon (KR); Sung-Un Lee, Taejon (KR); Sang-Rok Lee, Taejon (KR)

(73) Assignee: Electronics And Telecommunications Research Institute, Taejon (KR)

( * ) Notice: Subject to any disclaimer, the term of this patent is extended or adjusted under 35 U.S.C. 154(b) by 0 days.

(21) Appl. No.: 09/416,395

(22) Filed: Oct. 12, 1999

(30) Foreign Application Priority Data

Nov. 10, 1998 (KR) .............................. 98-47957

(51) Int. Cl.[7] ................................. G02F 1/35
(52) U.S. Cl. ................. 359/326; 359/344; 359/336; 359/341; 372/345; 372/20; 372/75
(58) Field of Search ................ 359/344, 336, 359/341, 326, 345; 372/20, 75

(56) References Cited

U.S. PATENT DOCUMENTS

| 5,264,960 A | 11/1993 | Glance ................ 359/344 |
| 5,450,229 A | 9/1995 | Wiesenfeld ............ 359/238 |
| 5,721,637 A * | 2/1998 | Simon et al. ............ 257/21 |

OTHER PUBLICATIONS

Joergensen et al., "4 Gb/s Optical Wavelength Conversion Using Semiconductor Optical Amplifiers," *IEEE Photonics Technology Letters*, 5(6):657–660, 1993.
Wiesenfeld et al., "Wavelength Conversion at 10 Gb/s using a Semiconductor Optical Amplifier," *IEEE Photonics Technology Letters*, 5(11):1300–1303, 1993.
Chelles et al., "Extinction Ratio of Cross–Gain Modulated Multistage Wavelength Converters: Models and Experiments," *IEEE Photonics Technology Letters*, 9(6):758–760, 1997.

* cited by examiner

*Primary Examiner*—Michael P. Stafira
*Assistant Examiner*—Roy M. Punnoose
(74) *Attorney, Agent, or Firm*—Seed IP Law Group PLLC

(57) ABSTRACT

An optical wavelength converter based on cross-gain modulation with wide input dynamic range, the converter including a semiconductor optical amplifier, a continuous wave source, and a probe beam controller. The semiconductor optical amplifier modulates probe power on the basis of pump power. The continuous wave source generates the probe beam and supplies the generated probe beam to the semiconductor optical amplifier. The probe beam controller adjusts bias current supplied to the continuous wave source and controls the probe power in proportion to the pump power.

4 Claims, 3 Drawing Sheets

*Prior Art*

OPTICAL WAVELENGTH CONVERTER BASED ON CROSS-GAIN MODULATION WITH WIDE INPUT POWER DYNAMIC RANGE

TECHNICAL FIELD

The present invention relates to an optical wavelength converter. More particularly, the present invention relates to an optical wavelength converter based on cross-gain modulation with wide input power dynamic range.

BACKGROUND OF THE INVENTION

Wavelength converters are the key elements in wavelength division multiplexed (WDM) networks and photonic switch blocks. They are the devices that convert the wavelength of optical transmission signals independently of transmission speed and transmission system. One important use is to avoid wavelength blocking in optical cross connects in WDM networks. Therefore, the converters increase the flexibility and the capacity of the network for fixed wavelengths. Among the wavelength conversion methods, cross-gain modulation (XGM), cross-phase modulation (XPM), and four-wave mixing (FWM) in semiconductor optical amplifiers (SOA's) have been widely studied and investigated. Wavelength converters by XGM in SOA's have the advantages of simple structure and high conversion efficiency. However, disadvantages include the extinction ratio degradation after conversion, the inversion of bit-stream, and the narrow input power dynamic range.

FIG. 1 shows a diagram for illustrating a conventional optical wavelength converter using cross-gain modulation.

As shown in FIG. 1, the intensity-modulated input signal beam at $\lambda_S$ and continuous wave beam at $\lambda_C$ are injected into a semiconductor optical amplifier 13. The input signal beam is the pump beam 15, and the continuous wave beam is the probe beam 16. The intensity of the continuous wave beam, i.e., probe beam 16, depends upon the amount of bias current loaded to the continuous wave source 12 from the current driver 11.

The operation principle relies on gain saturation in the semiconductor optical amplifier 13. A strong pump beam 15 is used to modulate the gain of the semiconductor optical amplifier 13. A probe beam 16 at desired wavelength is modulated according to the bit pattern of the pump beam 15 due to the effect of gain modulation. At the output, the wavelength converted beam is obtained by passing only the probe beam through a band pass filter 14. Therefore, the wavelength of the input signal, $\lambda_S$ is converted into the desired wavelength, $\lambda_C$.

Conventional optical converters using cross-gain modulation have several drawbacks. For example, the extinction ratio of the wavelength converted beam is low and bit stream is inversed. In addition, input power dynamic range is narrow.

SUMMARY OF THE INVENTION

The present invention provides an optical wavelength converter based on cross-gain modulation with wide input power dynamic range. An optical wavelength converter based on cross-gain modulation with wide input dynamic range in accordance with the present invention comprises a semiconductor optical amplifier, a continuous wave source, and a probe beam controller. The semiconductor optical amplifier modulates probe power on the basis of pump power. The continuous wave source generates the probe beam and supplies generated probe beam to the semiconductor optical amplifier. The probe beam controller supplies adequate bias current to the continuous wave source and the probe power changes in accordance with the pump power.

BRIEF DESCRIPTION OF THE DRAWINGS

The embodiments of the present invention will be explained with reference to the accompanying drawings, wherein.

DETAILED DESCRIPTION OF THE PREFERRED EMBODIMENTS

Figure 1:
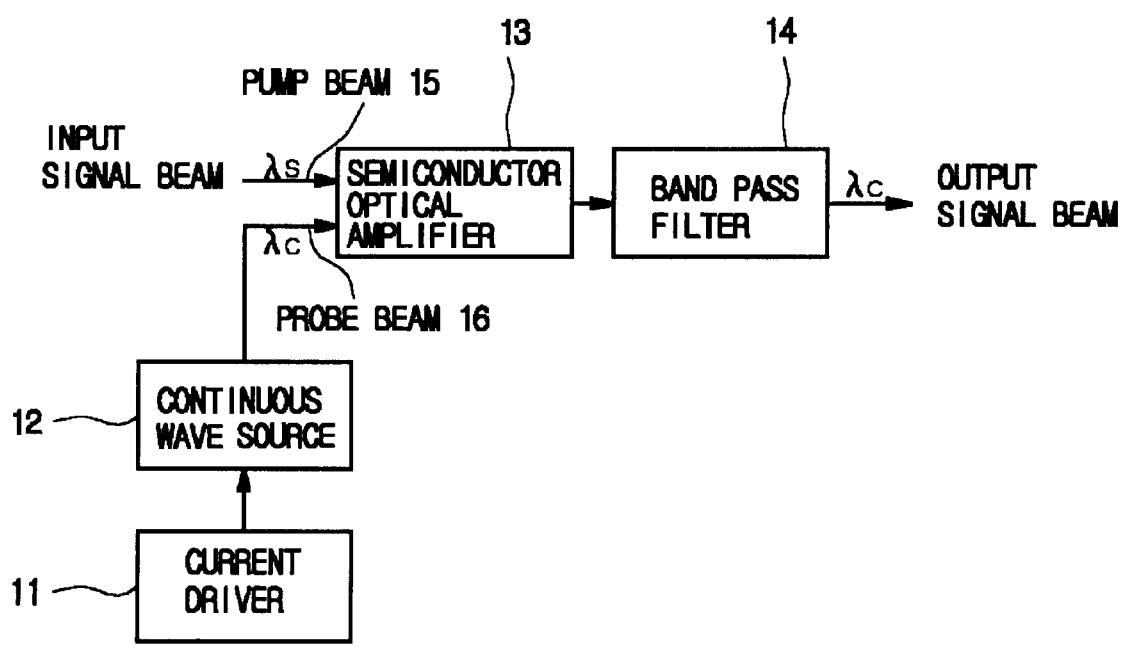
FIG. 1 shows a diagram for illustrating a conventional optical wavelength converter based on cross-gain modulation.
Figure 2:
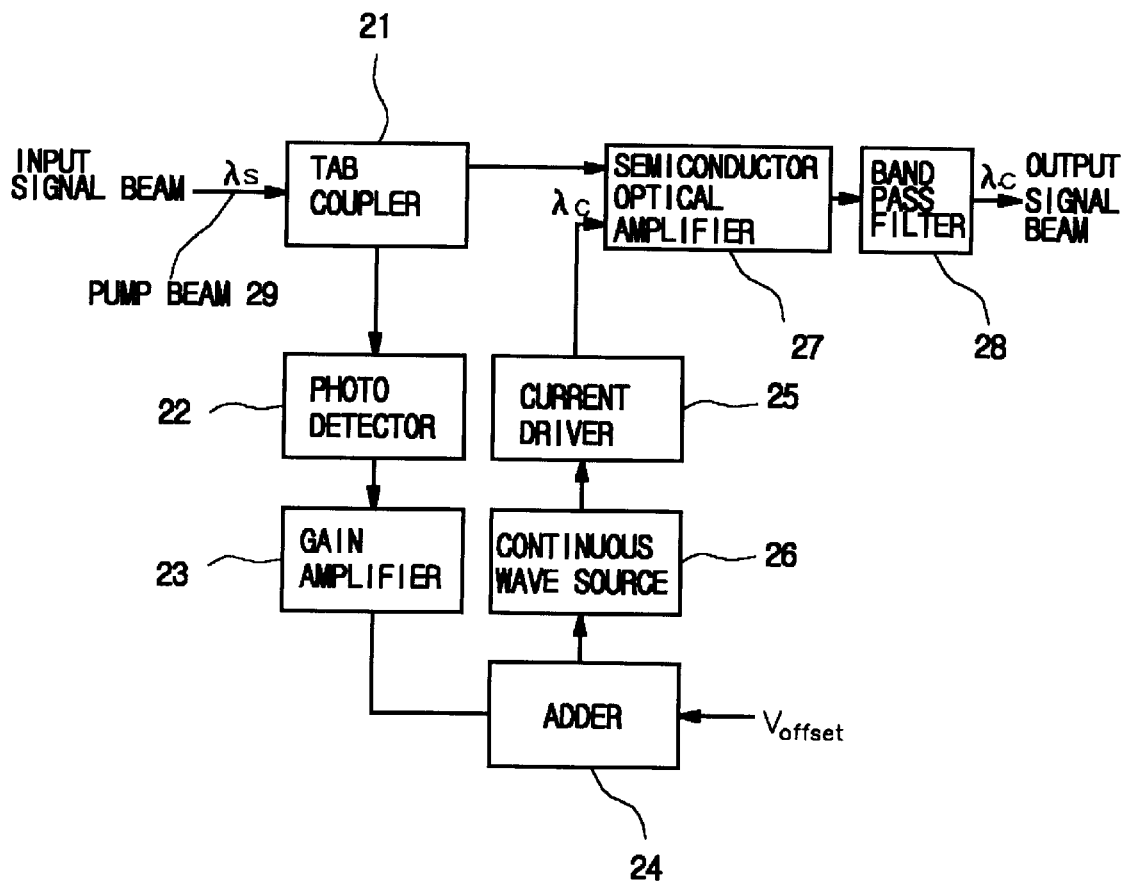
FIG. 2 shows a diagram for an optical wavelength converter based on cross-gain modulation with wide input dynamic range in accordance with the present invention.

FIG. 2 shows a diagram for an optical wavelength converter based on cross-gain modulation with wide input dynamic range in accordance with the present invention.

As shown in FIG. 2, the pump beam 29 at $\lambda_S$ and the probe beam 30 at $\lambda_C$ that is the output of the continuous wave source 26 are injected into the semiconductor optical amplifier 27. Portions of the pump beam 29 are extracted using the tap coupler 21. The tapped optical signal is converted into an electrical signal using the photo detector 22, and is electrically amplified by high gain amplifier 23. The output of the high gain amplifier 23 standing for the amount of the pump power is added onto the offset voltage ($V_{offset}$) at the adder 24, the output of which is received at the current driver 25 coupled to the input of the continuous wave source 26.

The offset voltage and the input pump power determine the current supplied to the continuous wave source 26. The gain of the high gain amplifier 23 is adjusted in order to produce the probe beam 30 with the power proportional to the pump power.

The pump beam 29 and the probe beam 30 are injected to the semiconductor optical amplifier 27 at the same time. The gain of the semiconductor optical amplifier 27 is determined by the intensity of the pump beam. In other words, the gain of the semiconductor optical amplifier 27 is modulated by the bit pattern of the input signal carried by the pump beam 29. Then probe beam is intensity-modulated by the gain modulation of the semiconductor optical amplifier 27, and then the bit pattern of the input signal is recorded on the probe beam 30. After this, the wavelength of the input signal $\lambda_S$ is converted into the desired wavelength $\lambda_C$.

The semiconductor optical amplifier 27 has the pump beam and the wavelength converted beam as outputs, and the outputs are supplied to the band pass filter 28. The band pass filter 28 filters out the pump beam and only the wavelength converted beam is passed to the output of the filter.

In the disclosed embodiment, an important function is to extract a part of the pump beam 29 using tap coupler 21 and to control bias current value supplied to the continuous wave source 26 automatically. Therefore, the intensity of the probe beam becomes proportional to the intensity of the pump beam. As a result, as the intensity of input signal varies, the area in which the performance of the optical wavelength converter maintains becomes wide and the input dynamic range is improved.

Figure 3:
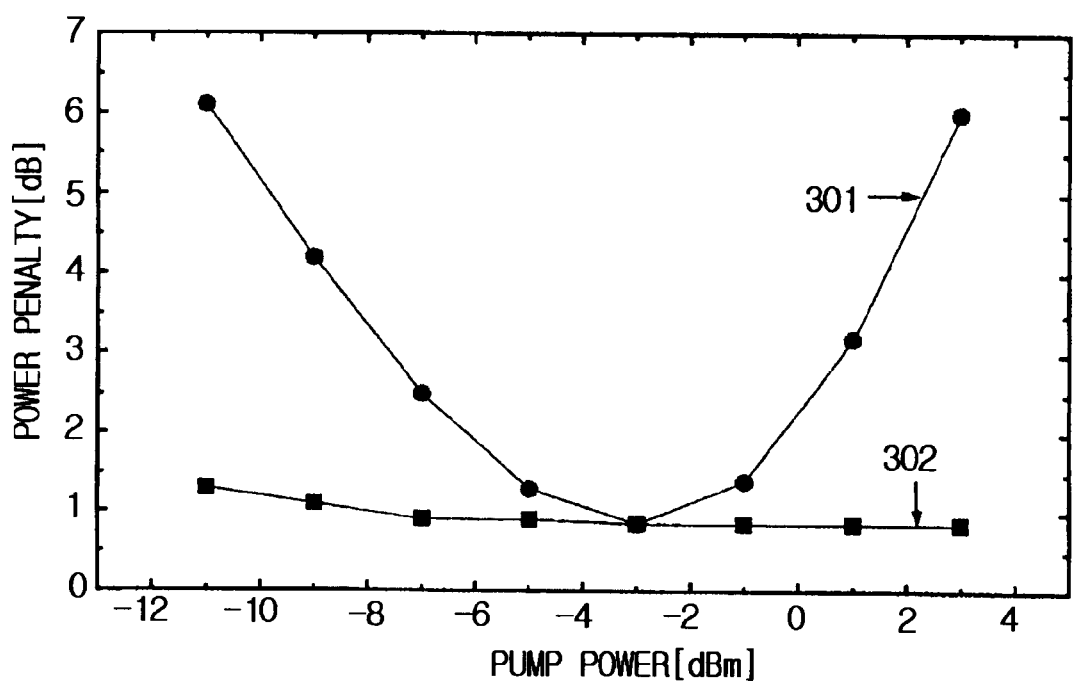
FIG. 3 shows a graph for illustrating the efficiency of the optical wavelength converter based on cross-gain modulation with wide input dynamic range in accordance with the present invention.

FIG. 3 shows the variation of power penalties for the pump powers. Power penalty is a performance measument of the optical wavelength converter. In the figure, power penalty 301 is measured while pump power is changed from −11 dBm to 3 dBm at intervals of 2 dB and probe power is −6 dBm. In addition, the power penalty 302 is shown in FIG. 3 when probe power is adjusted lower than pump power by about 3 dB in accordance with the present invention.

As shown in the power penalty 301 in which probe power doesn't get controlled and maintained constantly, the performance of the optical wavelength converter varies depending upon the change of the pump power. On the contrary, as shown in the power penalty 302 in which probe power is controlled, the performance of the optical wavelength converter remains steady regardless of the pump power. Therefore, an optical wavelength converter based on cross-gain modulation having the input dynamic range of more than 14 dB is implemented in accordance with the present invention.

As shown above, the disclosed embodiment automatically controls the probe power on the basis of the pump power and maintains optimal performance. As a result, an optical wavelength converter with wide input dynamic range is obtained. In spite of more than 10 dB fluctuation of input power, the present invention provides optimal extinction ratio and minimum power penalty.

Although representative embodiments have been disclosed for illustrative purposes, those skilled in related art will appreciate that various modifications, additions and substitutions are possible, without departing from the scope and spirit of the invention as recited in the accompanying claims.

What is claimed is:

1. An optical wavelength converter based on cross-gain modulation with wide input dynamic range comprising:

a semiconductor optical amplifier for modulating a probe beam on the basis of a pump beam;

a continuous wave source for generating the probe beam and supplying the said generated probe beam to said semiconductor optical amplifier; and a probe beam controller for supplying bias current to said continuous wave source and having the probe beam changed in accordance with changes in the power of the pump beam.

2. The optical wavelength converter with wide input dynamic range of claim 1, wherein said probe beam controller comprises:

means for extracting a portion from said pump beam;

optical detection means for converting the pump beam extracted by said extracting means into electronic signals; and means for adding said electronic signals to offset signals and supplying output bias current to said continuous wave source.

3. The optical wavelength converter with wide input dynamic range of claim 2, wherein said probe beam controller comprises an amplification means for amplifying electronic signals supplied by said optical detection means and supplying the amplified signals to said adding means.

4. The optical wavelength converter with wide input dynamic range of claim 2, wherein said probe beam controller comprises a current driver generating bias current on the basis of the output signals of said adding means and supplying said bias current to said continuous wave source.

* * * * *